(12) United States Patent
Chiang et al.

(10) Patent No.: US 11,514,982 B2
(45) Date of Patent: Nov. 29, 2022

(54) COMPUTATION UNIT INCLUDING AN ASYMMETRIC FERROELECTRIC DEVICE PAIR AND METHODS OF FORMING THE SAME

(71) Applicant: Taiwan Semiconductor Manufacturing Company Limited, Hsinchu (TW)

(72) Inventors: Katherine H. Chiang, New Taipei (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/470,216

(22) Filed: Sep. 9, 2021

(65) Prior Publication Data

US 2022/0284950 A1 Sep. 8, 2022

Related U.S. Application Data

(60) Provisional application No. 63/155,881, filed on Mar. 3, 2021.

(51) Int. Cl.
| | |
|---|---|
| G11C 11/22 | (2006.01) |
| G11C 11/54 | (2006.01) |
| G06N 3/063 | (2006.01) |
| H01L 29/51 | (2006.01) |
| H01L 29/78 | (2006.01) |
| H01L 29/66 | (2006.01) |
| H01L 21/28 | (2006.01) |
| H01L 27/1159 | (2017.01) |

(52) U.S. Cl.
CPC ............ *G11C 11/54* (2013.01); *G06N 3/0635* (2013.01); *G11C 11/223* (2013.01); *H01L 27/1159* (2013.01); *H01L 29/40111* (2019.08); *H01L 29/516* (2013.01); *H01L 29/6684* (2013.01); *H01L 29/78391* (2014.09)

(58) Field of Classification Search
CPC . G11C 11/54; G11C 11/223; H01L 29/78391; H01L 29/40111; H01L 27/1159; H01L 29/516; H01L 29/6684
USPC ....................................................... 365/145
See application file for complete search history.

(56) References Cited

U.S. PATENT DOCUMENTS

| | | | | |
|---|---|---|---|---|
| 8,674,746 | B1 * | 3/2014 | Staudinger | H03F 1/3258 |
| | | | | 327/333 |
| 10,312,342 | B2 * | 6/2019 | Alam | H01L 29/516 |
| 10,381,061 | B2 * | 8/2019 | Han | G11C 11/54 |
| 10,395,713 | B2 * | 8/2019 | Han | G11C 11/5621 |

(Continued)

*Primary Examiner* — Viet Q Nguyen
(74) *Attorney, Agent, or Firm* — The Marbury Law Group, PLLC

(57) ABSTRACT

A ferroelectric computation unit includes a first ferroelectric switching device that includes a first ferroelectric material portion and generates a digital output signal, and a second ferroelectric switching device that includes a second ferroelectric material portion and generates an analog output signal. An output node of one of the first ferroelectric switching device and the second ferroelectric switching device is electrically connected to a gate electrode of another of the first ferroelectric switching device and the second ferroelectric switching device to provide hybrid response characteristics of stochastic digital switching and analog switching.

20 Claims, 19 Drawing Sheets

(56) References Cited

U.S. PATENT DOCUMENTS

| | | | |
|---|---|---|---|
| 2012/0292665 A1* | 11/2012 | Marino | H01L 29/1029 257/E21.409 |
| 2014/0253183 A1* | 9/2014 | Holmes | H03K 3/01 327/109 |
| 2019/0115442 A1* | 4/2019 | Teo | H01L 21/044 |
| 2020/0105788 A1* | 4/2020 | Majhi | H01L 29/6684 |

* cited by examiner

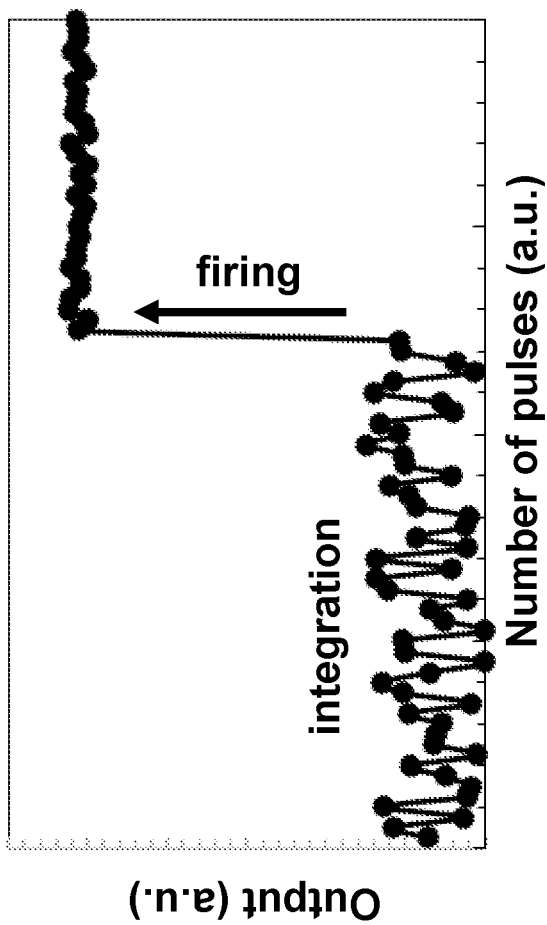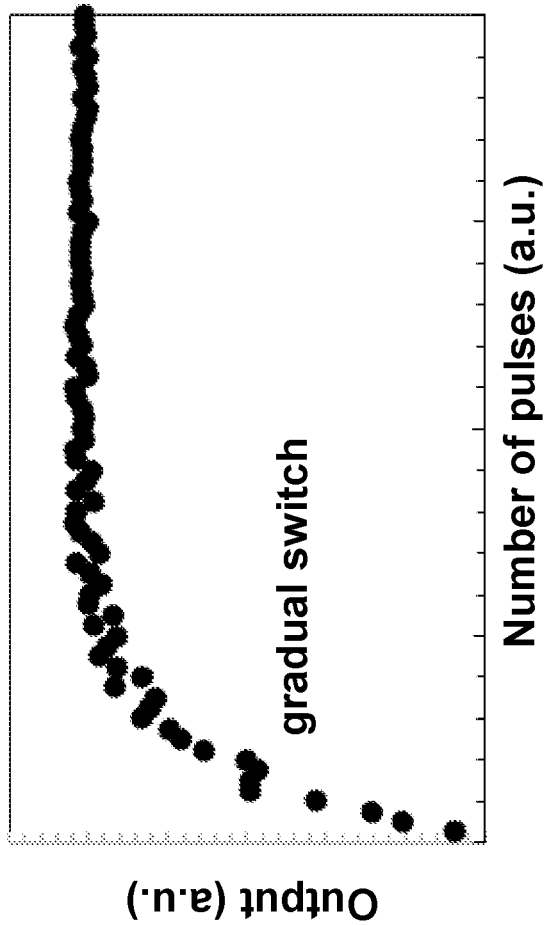

COMPUTATION UNIT INCLUDING AN ASYMMETRIC FERROELECTRIC DEVICE PAIR AND METHODS OF FORMING THE SAME

RELATED APPLICATIONS

This application claims the benefit of priority from U.S. Provisional Application No. 63/155,881, entitled "Neuromorphic Functional Unit by Large-Small Ferroelectric Device Pair," filed on Mar. 3, 2021, the entire contents of which are incorporated herein by reference for all purposes.

BACKGROUND

Device-centric neuromorphic computing has been difficult to realize because memory functions and threshold response functions need to be concurrently provided in a physically implemented computing device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a response curve of a first ferroelectric switching device as a function of a total number of input pulses according to an embodiment of the present disclosure.

FIG. 3B is a response curve of a second ferroelectric switching device as a function of a total number of input pulses according to an embodiment of the present disclosure.

DETAILED DESCRIPTION

Figure 1:
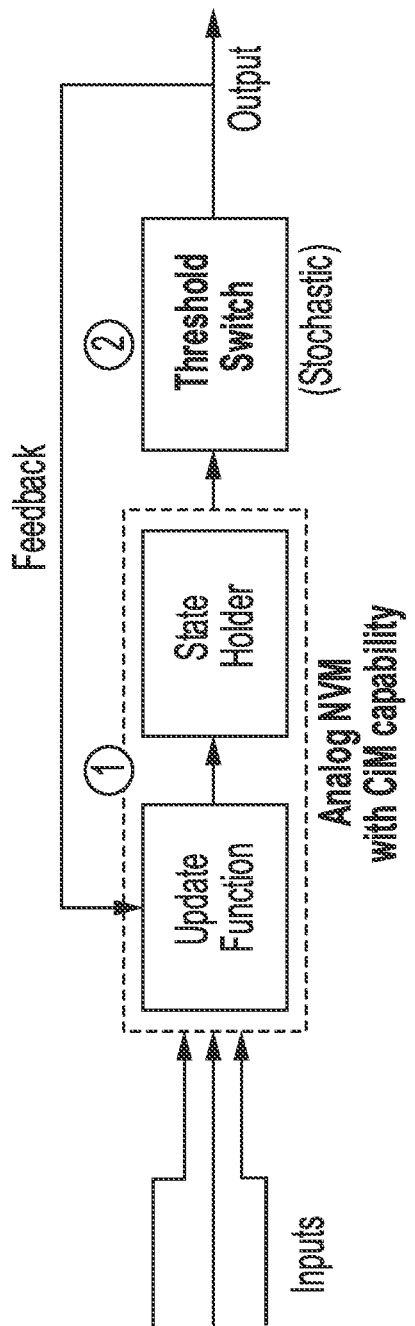
FIG. 1 is a schematic diagram of a computation unit according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A ferroelectric material is a material that may have spontaneous nonzero electrical polarization (i.e., non-zero total electrical dipole moment) when the external electrical field is zero. The spontaneous electrical polarization may be reversed by the application of a strong external electric field in the opposite direction. The electrical polarization is dependent not only on the external electrical field at the time of measurement, but also on the history of the external electrical field. Thus, the electrical polarization exhibits a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field. For the purposes of forming memory devices, it is generally desirable to have high remnant polarization and high coercive field. High remnant polarization may increase the magnitude of an electrical signal. High coercive field makes the memory devices more stable against perturbations caused by noise-level electrical field and interferences.

Generally, the structures and methods of various embodiments disclosed herein may be used to provide complementary metal-oxide-semiconductor (CMOS) compatible device realization for neuromorphic computation units. As used herein, "neuromorphic computing" refers to a computing method in which an electronic circuit is used to mimic the neuro-biological architecture found in biological neural systems. Embodiments of the present disclosure may simultaneously use memory responses in the form of an analog output and stochastic responses in the form of a digital output as implemented in devices of a same type such as ferroelectric field effect transistors, which are also known as ferroelectric FETs or FeFETs.

Generally, there has been no known approaches for device-centric neuromorphic realization. Prior efforts to emulate a neural system implemented the memory function through memory cells and implemented the threshold response function through emulating circuits. Use of conventional semiconductor circuits to emulate a neural behavior limits the benefits of the neuromorphic architecture over the Boolean/von Neumann architecture because the conventional semiconductor circuits operate on the Boolean logic and the multiple devices need to be combined in a circuit to exhibit a characteristic of a neural circuit.

Various embodiments disclosed herein provide a device-based solution that provides implementation of the neuromorphic architecture, and thus, provides enhancement in performance, energy efficiency, and device density over circuit-centric approaches known in the art. Specifically, devices of a same type, such as a pair of ferroelectric devices having a same set of structural components and differing in size, may be used to generate neural response characteristics that may be used in a neural computation device. The various aspects of the present disclosure are now described in detail with reference to accompanying drawings.

Referring to FIG. 1, a computation unit according to an embodiment of the present disclosure is illustrated. The computation unit may be a neuromorphic computation unit that includes a combination of an analog non-volatile memory (NVM) device with computation-in-memory (CiM) capability and a digital stochastic threshold switch device. The analog non-volatile memory device and the digital stochastic threshold switch may be connected in sequential stages. Specifically, one of the analog non-volatile memory device and the digital stochastic threshold switch device may be at an input stage (i.e., a first stage) to which input signals are supplied, and the other of the analog non-volatile memory device and the digital stochastic threshold switch device may be at an output state (i.e., a second stage) from which output signals are generated. In some embodiments, a feedback mechanism may be provided so that the output of the output stage may be fed back as an additional input to the input stage. In one embodiment, the analog non-volatile memory device may be at the input stage and the digital stochastic threshold switch may be at the output stage. In another embodiment, the digital stochastic threshold switch may be at the input stage and the analog non-volatile memory device may be at the output stage.

According to an aspect of the present disclosure, the digital stochastic threshold switch generates a digital output having no more than four output states. For example, the digital output may be a binary output, a ternary output, or a quaternary output. In one embodiment, the digital output may be a binary output. In one embodiment, the ratio of intensities between each pair of output signals of the digital stochastic threshold switch may be in a range from $1.0\times10^{-9}$ to $1.0\times10^{9}$, such as from $1.0\times10^{-6}$ to $1.0\times10^{6}$, from $1.0\times10^{-3}$ to $1.0\times10^{3}$, from $1.0\times10^{-2}$ to $1.0\times10^{2}$, and/or from 0.1 to 10. The intensity of the output signal may be measured in the magnitude of the output electrical current or the magnitude of the output electrical voltage. The analog non-volatile memory device may generate an analog output signal, i.e., a signal that may have a sufficient number of states (such as at least 10, and typically greater than 1,000 and/or greater than $1.0\times10^{-6}$) such that the magnitude of the output signal is a continuously varying variable for all practical purposes. For example, upon sorting all possible output states in an increasing order or in a decreasing order for an output variable (such as an output voltage or an output current), the ratio of two values of the output variable for any two neighboring pair of output states may be in a range from 0.5 to 2.0, and may be in a range from 0.9 to 1.1.

One of the analog non-volatile memory device and the digital stochastic threshold switch may include an update function block. The update function block may provide reception of input signals and initiates a change in the output of the computation unit. In one embodiment, the analog non-volatile memory device may include the update function block. In another embodiment, the digital stochastic threshold switch may include the update function block. The analog non-volatile memory device includes a state holder functional block, which provides the function of "remembering and learning" from past experiences. The digital stochastic threshold switch comprises a threshold switch functional block, which provides the functionality of incorporating stochasticity into a threshold-gated response.

Figure 2A:
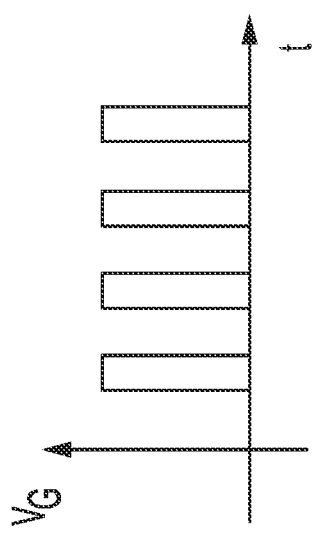
FIG. 2A is an exemplary input pulse pattern that may be applied to a computation unit of the present disclosure.

Referring to FIG. 2A, an exemplary input pulse pattern that may be applied to a computation unit of the present disclosure is illustrated. The input pulse may comprise a voltage pulse. Depending on the size and configuration of the computation unit, the magnitude of the voltage may be in a range from 0.5 V to 50 V, such as from 1.0 V to 12 V, although lesser and greater voltages may also be used. The frequency of the input pulse may be in a range from 1 Hz to 100 GHz such as from 60 Hz to 1 GHz, although lower and higher frequencies may be used. In embodiments in which the computation unit of the present disclosure comprises ferroelectric devices, the period of the input pulse may be the same as, or may be greater than, a response time of a ferroelectric material within the ferroelectric devices, and may be greater than 10 ns and/or may be greater than 100 ns. Alternatively, the input pulse may comprise a current pulse.

Figure 2B:
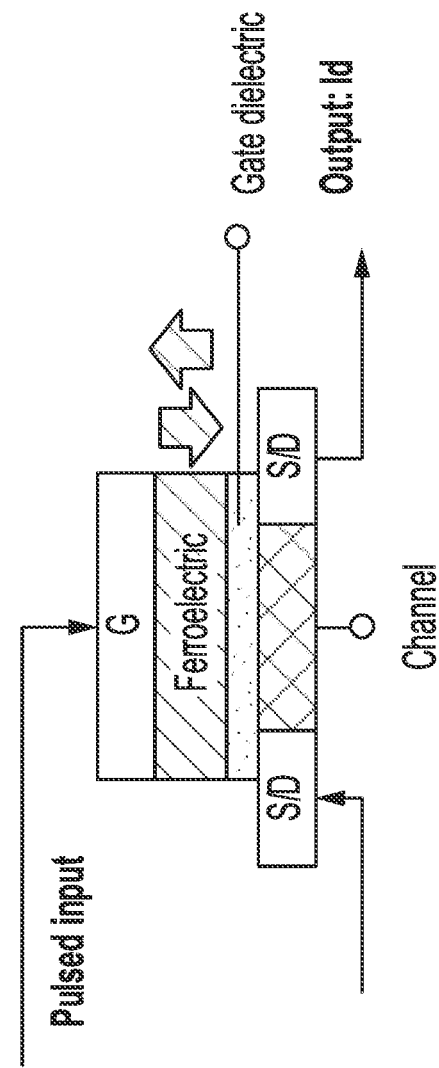
FIG. 2B is a schematic vertical cross-sectional view of a ferroelectric field effect transistor that may be used as a component of the computation unit of the present disclosure.

Referring to FIG. 2B, a ferroelectric field effect transistor is illustrated, which may be used as a component of the computation unit of the present disclosure. According to an aspect of the present disclosure, a pair of physical devices using a same ferroelectric material may be used to implement an analog non-volatile memory device and a digital stochastic threshold switch. In this embodiment, the pair of physical devices may be ferroelectric devices that provide the functionalities of the state holder functional block and the threshold switch functional block through intrinsic properties of a ferroelectric material. A ferroelectric-based neuromorphic chip including neuromorphic functional units composed of a respective ferroelectric device pair of different dimensions may be used. The dimensions may be selected such that a smaller ferroelectric device functions as the digital stochastic threshold switch, and a larger ferroelectric device functions as the analog non-volatile memory device.

Generally, a ferroelectric material portion is provided in a gate stack. The ferroelectric material portion may have a single ferroelectric domain, for example, for a ferroelectric field effect transistor embodying the digital stochastic threshold switch, and may have multiple ferroelectric domains, for example, for a ferroelectric field effect transistor embodying the analog non-volatile memory device. Each ferroelectric domain may have respective electric polarization that may point upward or downward. Depending on the direction of the electrical polarization of each ferroelectric domain, the threshold voltage of the ferroelectric field effect transistor may increase or decrease. Generally, a ferroelectric material is used in gate stacks of ferroelectric field effect transistors to implement a digital stochastic threshold switch or an analog non-volatile memory device. The ferroelectric material may be used to incorporate neuromorphic computing capability into general logic circuits. Upon incorporating the ferroelectric material in a gate stack, a variety of channel materials may be used for the underlying semiconductor channel. Any channel configuration may be used for the ferroelectric field effect transistors, which may use a planar configuration, a fin configuration, an omega configuration, etc.

According to an aspect of the present disclosure, retention tuning of a ferroelectric material may be used to tune the neuron behavior of the ferroelectric computing device of the present disclosure. The retention tuning includes optimization of resetting and forgetting, which may be used to tune the characteristics of a threshold switching component. Retention tuning depends on the doping composition of the ferroelectric material, the electrode materials, and the anneal condition used to crystallize the ferroelectric material. The present state of the ferroelectric material as determined by past history of the state of the ferroelectric material may have more sustainable impact on the response threshold at a longer retention. Generally, the longer the retention of the state of the ferroelectric material, the slower the self-reset process of the stochastic behavior in the ferroelectric material.

In an illustrative example, the lateral dimensions of a ferroelectric material portion in a smaller ferroelectric device may be less than 100 nm, and the lateral dimensions of a ferroelectric material portion in a larger ferroelectric device may be greater than 500 nm. The thickness of the ferroelectric material portions may be in a range from 10 nm to 100 nm, although lesser and greater thicknesses may also be used. In one embodiment, the channel width of a ferroelectric field effect transistor implementing an analog non-volatile memory device may have a channel width greater than 500 nm, and the channel width of another ferroelectric field effect transistor implementing a digital stochastic threshold switch may have a channel width less than 100 nm.

Referring to FIG. 3A, a response curve of a first ferroelectric switching device is illustrated for an input pulse pattern illustrated in FIG. 2A as a function of a cumulative number of applied input pulses. The first ferroelectric switching device embodies a digital stochastic threshold switch. In one embodiment, the first ferroelectric switching device may be a ferroelectric field effect transistor having a configuration shown in FIG. 2B and having a channel width less than 100 nm and having a channel length less than 100 nm. In one embodiment, the ferroelectric field effect transistor may comprise an ultra-scaled ferroelectric field effect transistor having a width less than 100 nm and having a length less than 50 nm. Such field effect transistors display abrupt, stochastic switching between discrete states after certain numbers of input pulses. The desired number of input pulses to trigger "firing" of the switching device is stochastic, i.e., probabilistically distributed over a range of numbers. In one embodiment, the discrete states may be binary states having different magnitudes of an output signal, such as a drain current Id. In the illustrative example, the ratio of the output current between an "on" state and an "off" state may be greater than 100.

Referring to FIG. 3B, a response curve of a second ferroelectric switching device is illustrated for an input pulse pattern illustrated in FIG. 2A as a function of a cumulative number of applied input pulses. The second ferroelectric switching device embodies an analog non-volatile memory device. In one embodiment, the second ferroelectric switching device may be a large ferroelectric field effect transistor having a configuration shown in FIG. 2B and having a channel width greater than 100 nm. In one embodiment, the channel length of the large ferroelectric field effect transistor may be greater than 100 nm. In one embodiment, the second ferroelectric switching device may be a large ferroelectric field effect transistor having a configuration shown in FIG. 2B and having a channel width greater than 500 nm. In one embodiment, the channel length of the large ferroelectric field effect transistor may be greater than 500 nm. Statistically, the probability of a complete switching of a ferroelectric device including multiple ferroelectric domains decreases exponentially within an increase in the area of the ferroelectric material portion. Thus, the large ferroelectric field effect transistor embodying the analog non-volatile memory device provides a gradual switching response through continuous state changes with an increasing number of applied input pulses. In one embodiment, the continuous state change is represented by a continuous change in the magnitude of an output signal, such as a drain current Id. In an illustrative example, the incremental change in the magnitude of the output current upon application of an input pulse may be less than 100%, such as less than 50%, of the magnitude of the output current from an immediately preceding measurement. Generally, the output of the second ferroelectric switching device embodying the analog non-volatile memory device may be analog signals.

In one embodiment, the area of the ferroelectric material portion in a ferroelectric field effect transistor may be a parameter that determines whether the response characteristic of a ferroelectric field effect transistor provides a stochastic threshold switching response or an analog non-volatile memory response. In one embodiment, the channel length of the ferroelectric material portion in a ferroelectric field effect transistor may be a parameter that determines whether the response characteristic of a ferroelectric field effect transistor provides a stochastic threshold switching response or an analog non-volatile memory response. In one embodiment, the channel width of the ferroelectric material portion in a ferroelectric field effect transistor may be a parameter that determines whether the response characteristic of a ferroelectric field effect transistor provides a stochastic threshold switching response or an analog non-volatile memory response.

It is understood that the distinction between the stochastic threshold switching response and the analog non-volatile memory response as a function of dimensions of a ferroelectric material portion in a ferroelectric field effect transistor is not abrupt, but the characteristics of the ferroelectric field effect transistor changes gradually between the stochastic threshold switching response and the analog non-volatile memory response over a transition regime. Generally, the larger the ferroelectric field effect transistor, the less stochastic the switching behavior is and the more gradual and continuous the switching behavior is. In some embodiments, the channel length of a ferroelectric field effect transistor may be a more controlling parameter than the channel width of the ferroelectric field effect transistor. Some ratios between the channel length and the channel width may, or may not, be preferable for each switching characteristic, and dimensions of the first ferroelectric field effect transistor and the second ferroelectric field effect transistor may be selected to provide a pair of optimized response characteristics depending on the computation unit. Generally, the switching probability of each ferroelectric domain depends on the coercivity field Ec of a ferroelectric material portion (which may have a form of a ferroelectric film) and the voltage amplitude/pulse width of the applied pulse train. The criteria for selecting a particular response characteristic depend on the application for which the computation unit is used. The probability for switching of a ferroelectric polarization in a ferroelectric grain may be tuned through design of the pattern of the pulse train.

Figure 3C:
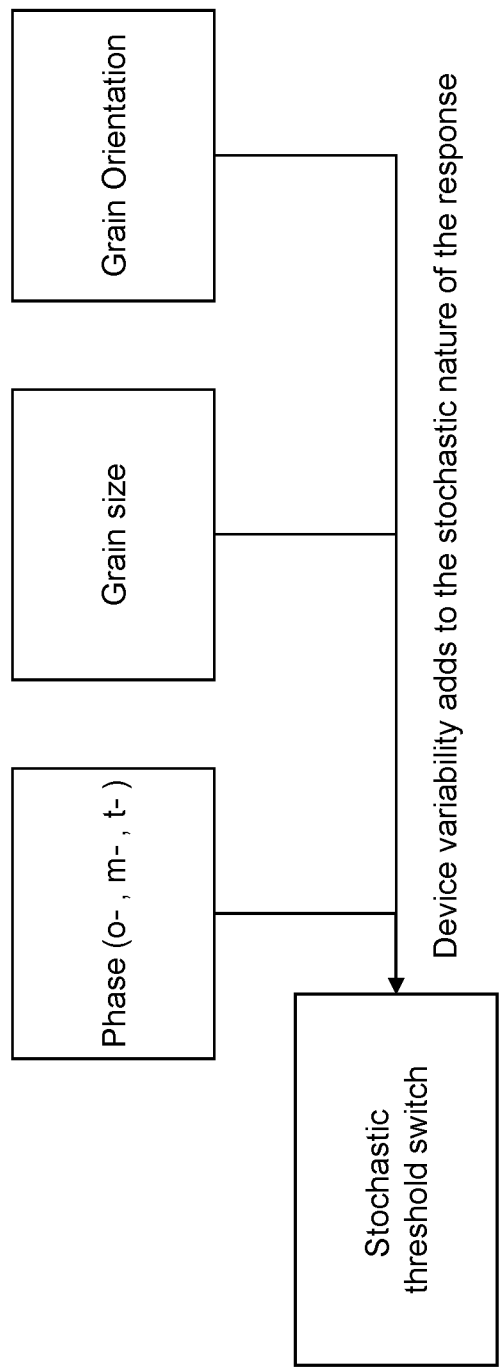
FIG. 3C is a diagram illustrating factors that affect the response characteristics of a digital stochastic threshold switching device according to an embodiment of the present disclosure.

Referring to FIG. 3C, factors that affect the response characteristics of a digital stochastic threshold switching device are illustrated. The factors include the phase of the ferroelectric material, the grain size of the ferroelectric material, and the grain orientation of the ferroelectric material. For example, the fraction of the ferroelectric material in an o-phase, the fraction of the ferroelectric material in an m-phase, and the fraction of the ferroelectric material in the t-phase matters in determining the response characteristics of the ferroelectric material portion in a ferroelectric field effect transistor. Device variability derived from variations in the phase of the ferroelectric material, the grain size of the ferroelectric material, and the grain orientation of the ferroelectric material, as introduced during manufacture of the ferroelectric field effect transistor, adds to the stochastic nature of the response of each ferroelectric field effect transistor. This feature may be advantageously used to increase the stochasticity of the digital stochastic threshold switching device.

A first ferroelectric device (such as a first ferroelectric field effect transistor) embodying the digital stochastic threshold switching device and a second ferroelectric device (such as a second ferroelectric field effect transistor) embodying the analog non-volatile memory device may be electrically connected within a computation unit in a variety of ways. FIGS. 4-12 illustrate examples of configurations in which the first ferroelectric device (comprising a first "small" field effect transistor having a smaller area for a ferroelectric material portion underlying a first gate electrode) is electrically connected to a second ferroelectric device (comprising a second "large" field effect transistor having a large area for a ferroelectric material portion underlying a second gate electrode). Each first ferroelectric field effect transistor functioning as the digital stochastic threshold switching device is labeled with a "small" label, and each second ferroelectric field effect transistor functioning as the analog non-volatile memory device is labeled with a "large" label.

Figure 4:
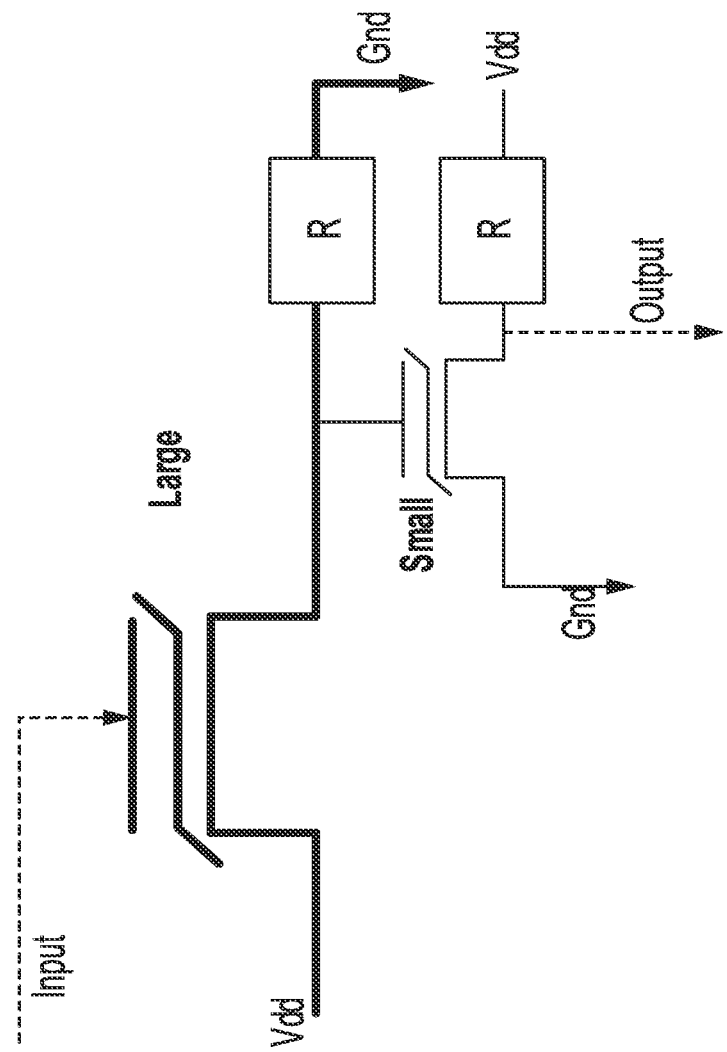
FIG. 4 is a schematic diagram illustrating a first configuration of a ferroelectric computation unit according to an embodiment of the present disclosure.

Referring to FIG. 4, a first configuration of a ferroelectric computation unit is illustrated. The ferroelectric computation unit comprises a first ferroelectric switching device (comprising a "small" ferroelectric field effect transistor) comprising a first ferroelectric material portion (represented by an "N-shaped" symbol located between a first gate electrode and a first current channel of the "small" ferroelectric field effect transistor) having a first areal size and disposed between a first gate electrode and a first current channel and modulating electrical conductivity of the first current channel depending on a first bias voltage at the first gate electrode and generating a digital output signal. The ferroelectric computation unit comprises a second ferroelectric switching device (comprising a "large" ferroelectric field effect transistor) comprising a second ferroelectric material portion (represented by an "N-shaped" symbol located between a second gate electrode and a second current channel of the "large" ferroelectric field effect transistor) having a second areal size that is greater than the first areal size and disposed between a second gate electrode and a second current channel and modulating electrical conductivity of the second current channel depending on a second bias voltage at the second gate electrode and generating an analog output signal.

Generally, an output node of one of the first ferroelectric switching device and the second ferroelectric switching device is electrically connected to a gate electrode of another of the first ferroelectric switching device and the second ferroelectric switching device. For example, the output node of the second ferroelectric switching device (comprising the "large" ferroelectric field effect transistor) is electrically connected to the first gate electrode of the first ferroelectric switching device (comprising the "small" ferroelectric field effect transistor).

In one embodiment, the input signal for the computation unit (such as the input pulse illustrated in FIG. 2A) may be applied to the second gate electrode of the second ferroelectric switching device. In one embodiment, a first resistor (labeled "R") is connected in a series connection with the first ferroelectric switching device between a power supply node Vdd and an electrical ground node Gnd, and a second resistor (labeled "R") is connected in a series connection with the second ferroelectric switching device between the power supply node Vdd and the electric ground node Gnd.

Generally, the first ferroelectric switching device (such as the "small" ferroelectric field effect transistor) has stochastic switching characteristics in which determination of a digital output signal is probabilistic within an input voltage range for the first bias voltage (which is applied to the first gate electrode of the "small" ferroelectric field effect transistor). In one embodiment, the digital output signal is selected from a set of no more than four discrete output signals. For example, the ferroelectric material portion of the "small"

field effect transistor may include no more than three ferroelectric grains. In one embodiment, the digital output signal is selected from a set of no more than three discrete output signals. For example, the ferroelectric material portion of the "small" field effect transistor may include no more than two ferroelectric grains. In one embodiment, the digital output signal is selected from a set of two discrete output signals. In this embodiment, the digital output signal may be a binary signal. For example, the ferroelectric material portion of the "small" field effect transistor may include a single ferroelectric grain.

In one embodiment, the first ferroelectric material portion comprises a ferroelectric material domain having a same ferroelectric polarization therein and occupying at least 80% of an entire volume of the first ferroelectric material portion. In this embodiment, the ferroelectric property of the predominant ferroelectric grain dominates the response characteristics of the "small" ferroelectric field effect transistor. In one embodiment, the second ferroelectric material portion comprises at least five ferroelectric material domains, such as at least 10 ferroelectric material grains and/or at least 100 ferroelectric grains, occupying a respective volume that is less than 25% of an entire volume of the second ferroelectric material portion.

In one embodiment, the first ferroelectric material portion and the second ferroelectric material portion have a same thickness and a same material composition. In this embodiment, the first ferroelectric switching device (embodying a digital stochastic threshold switch device) and the second ferroelectric switching device (embodying an analog non-volatile memory device with computation-in-memory capability) may be formed using a same set of processing steps, in which a ferroelectric material layer is deposited and patterned to form the first ferroelectric material portion having the first areal size and the second ferroelectric material portion having the second areal size. A common set of patterning steps, such as a combination of a lithographic photoresist patterning step and an anisotropic etch process, may be used to pattern the ferroelectric material layer. In one embodiment, a ratio of the second areal size to the first areal size is in a range from 4 to 1,000, such as from 10 to 300. A lower limit for the ratio of the second areal size to the first areal size can be determined by the condition that the second areal size should provide continuous switching at a macroscopic level, and the first areal size should provide stochastic switching. The upper limit for the ratio of the second areal size to the first areal size can be determined by the physical size limitation of the device implementing the second areal size.

In one embodiment, the first ferroelectric switching device comprises a first field effect transistor (such as the "small" ferroelectric field effect transistor) in which the first current channel is a first semiconductor channel and the first ferroelectric material portion is a portion of a first gate dielectric, and the second ferroelectric switching device comprises a second field effect transistor (such as the "large" ferroelectric field effect transistor) in which the second current channel is a second semiconductor channel and the second ferroelectric material portion is a portion of a second gate dielectric.

Figure 5:
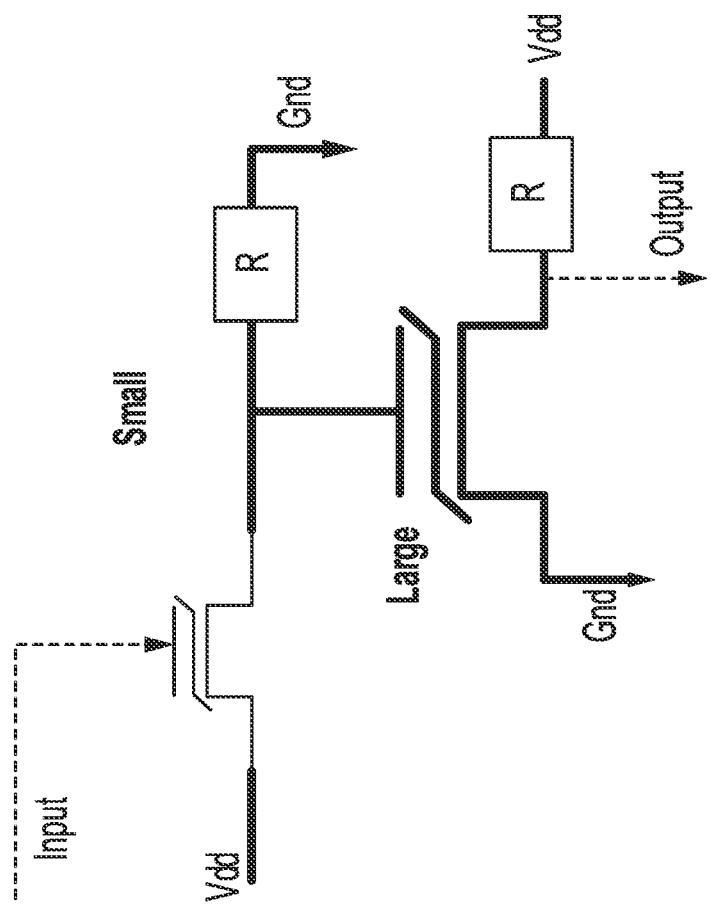
FIG. 5 is a schematic diagram illustrating a second configuration of a ferroelectric computation unit according to an embodiment of the present disclosure.

Referring to FIG. 5, a second configuration of the ferroelectric computation unit is illustrated, which may be derived from the first configuration of the ferroelectric computation unit by exchanging the locations of the first ferroelectric switching device (comprising a "small" ferroelectric field effect transistor) and the second ferroelectric switching device (comprising a "large" ferroelectric field effect transistor). The output node of the first ferroelectric switching device (comprising the "small" ferroelectric field effect transistor) is electrically connected to the second gate electrode of the second ferroelectric switching device (comprising the "large" ferroelectric field effect transistor).

In one embodiment, the input signal for the computation unit (such as the input pulse illustrated in FIG. 2A) may be applied to the first gate electrode of the first ferroelectric switching device. In one embodiment, a first resistor (labeled "R") is connected in a series connection with the first ferroelectric switching device between a power supply node Vdd and an electrical ground node Gnd, and a second resistor (labeled "R") is connected in a series connection with the second ferroelectric switching device between the power supply node Vdd and the electric ground node Gnd.

Figure 6:
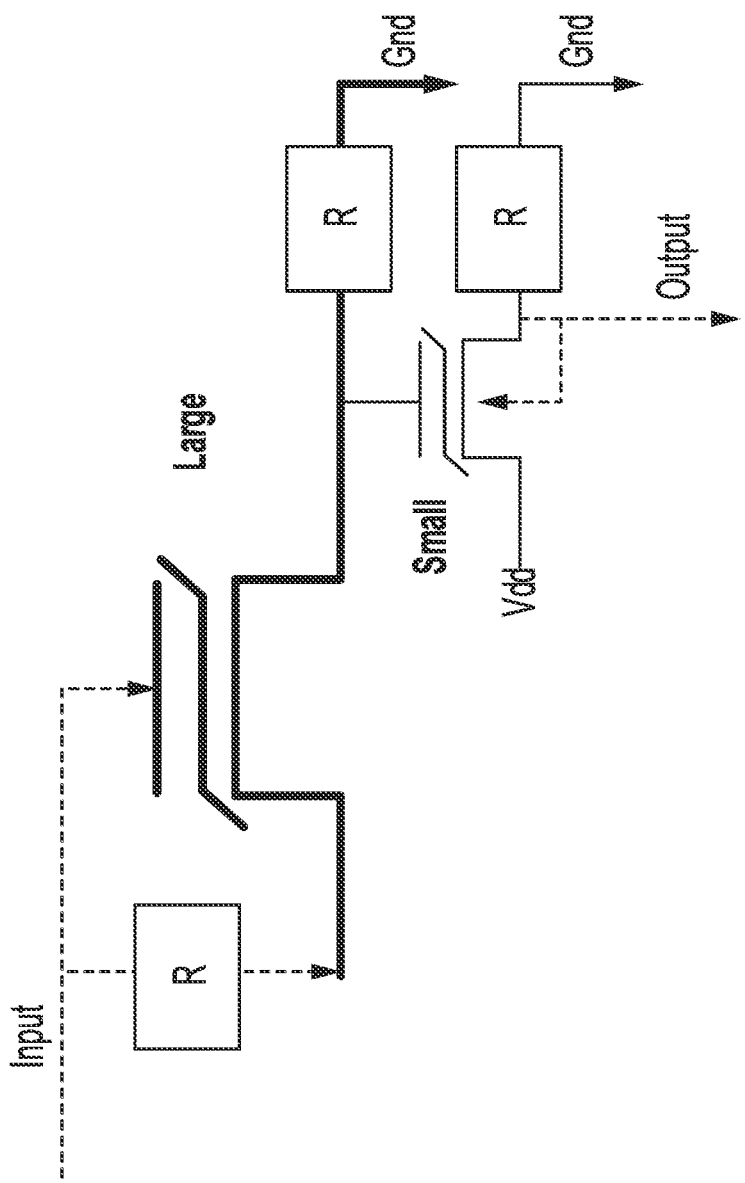
FIG. 6 is a schematic diagram illustrating a third configuration of a ferroelectric computation unit according to an embodiment of the present disclosure.

Referring to FIG. 6, a third configuration of the ferroelectric computation unit is illustrated, which may be derived from the first configuration of the ferroelectric computation unit by electrically connecting a drain region of the second ferroelectric switching device (such as the "large" ferroelectric field effect transistor) to the input node of the ferroelectric computation unit through an input-side resistor (labeled "R"). In this embodiment, the second gate electrode of the second "large" ferroelectric field effect transistor may be connected to an input node of the second ferroelectric computation unit, and may be connected to the drain region of the second ferroelectric computation unit through the input-side resistor. In this embodiment, the first ferroelectric switching device (comprising the "small" ferroelectric field effect transistor) is actuated only while the input signal to the ferroelectric computation unit is turned on, i.e., only while the applied pulse to the second gate electrode has a non-zero voltage.

Generally, a drain region of one of the first ferroelectric switching device and the second ferroelectric switching device may be connected an input node of the ferroelectric computation unit through an input-side resistor. In this embodiment, the input node of the ferroelectric computation unit may be connected directly to the gate electrode of the one of the first ferroelectric switching device and the second ferroelectric switching device. Specifically, the drain region of the second ferroelectric switching device may be connected an input node of the ferroelectric computation unit through an input-side resistor, and the input node of the ferroelectric computation unit may be connected directly to the gate electrode of the second ferroelectric switching device. A first resistor (labeled "R") may be connected in a series connection with the first ferroelectric switching device between a power supply node Vdd and an electrical ground node Gnd. A second resistor (labeled "R") may be connected in a series connection with the second ferroelectric switching device between the input-side resistor and the electric ground node Gnd. Optionally, the body of the "small" ferroelectric field effect transistor may be electrically connected to a source region or a drain region of the "small" ferroelectric field effect transistor.

Figure 7:
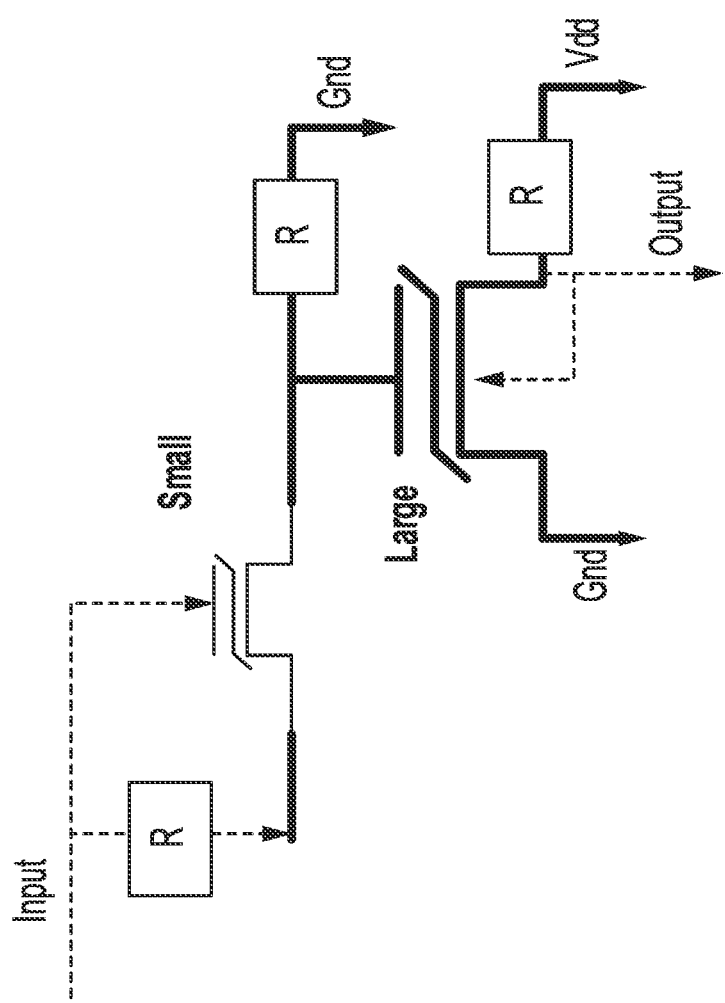
FIG. 7 is a schematic diagram illustrating a fourth configuration of a ferroelectric computation unit according to an embodiment of the present disclosure.

Referring to FIG. 7, a fourth configuration of the ferroelectric computation unit is illustrated, which may be derived from the third configuration of the ferroelectric computation unit by exchanging the locations of the first ferroelectric switching device (comprising a "small" ferroelectric field effect transistor) and the second ferroelectric switching device (comprising a "large" ferroelectric field effect transistor). The output node of the first ferroelectric switching device (comprising the "small" ferroelectric field effect transistor) is electrically connected to the second gate electrode of the second ferroelectric switching device (comprising the "large" ferroelectric field effect transistor).

In one embodiment, the drain region of the first ferroelectric switching device may be connected an input node of the ferroelectric computation unit through an input-side resistor, and the input node of the ferroelectric computation unit may be connected directly to the gate electrode of the first ferroelectric switching device. A first resistor (labeled "R") may be connected in a series connection with the first ferroelectric switching device between the input-side resistor and the electric ground node Gnd. A second resistor (labeled "R") may be connected in a series connection with the second ferroelectric switching device between a power supply node Vdd and an electrical ground node Gnd. Optionally, the body of the "large" ferroelectric field effect transistor may be electrically connected to a source region or a drain region of the "large" ferroelectric field effect transistor.

Figure 8:
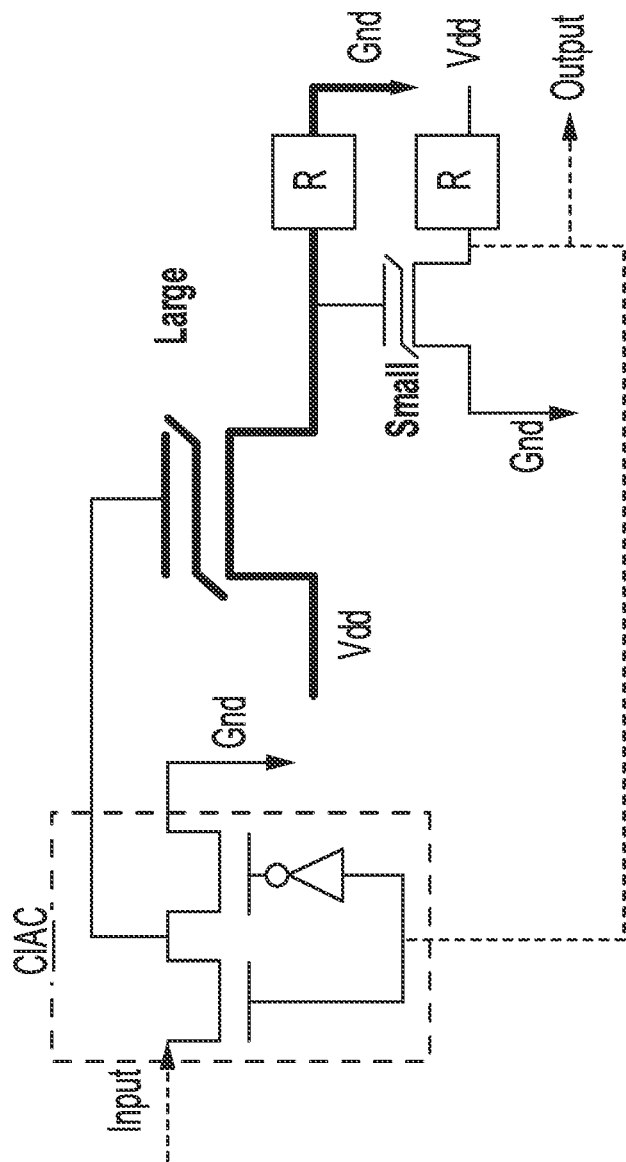
FIG. 8 is a schematic diagram illustrating a fifth configuration of a ferroelectric computation unit according to an embodiment of the present disclosure.

Referring to FIG. 8, a fifth configuration of the ferroelectric computation unit is illustrated, which may be derived from any of the first configuration and the third configuration of the ferroelectric computation unit by providing a conditional input activation circuit CIAC. The conditional input activation circuit CIAC may be a feedback circuit that activates, or deactivates, an input to the ferroelectric computation unit based on a pre-existing output state of the ferroelectric computation unit. In this embodiment, the input signal to the ferroelectric computation unit is applied to a power supply node of an inverter circuit including a series connection of two transistors of which two gates are provided with a complementary signal generated from the output node of the ferroelectric computation unit. By using a configuration in which the output of the inverter circuit is non-zero only when the input signal to the ferroelectric computation unit is non-zero and when a pre-existing output signal of the ferroelectric computation unit is non-zero, input to the ferroelectric computation unit may be activated or de-activated based on a pre-existing output state of the ferroelectric computation unit, thereby enabling a sequential logic. Generally, the inverter circuit may be replaced with any alternative inverter circuit known in the art.

Figure 9:
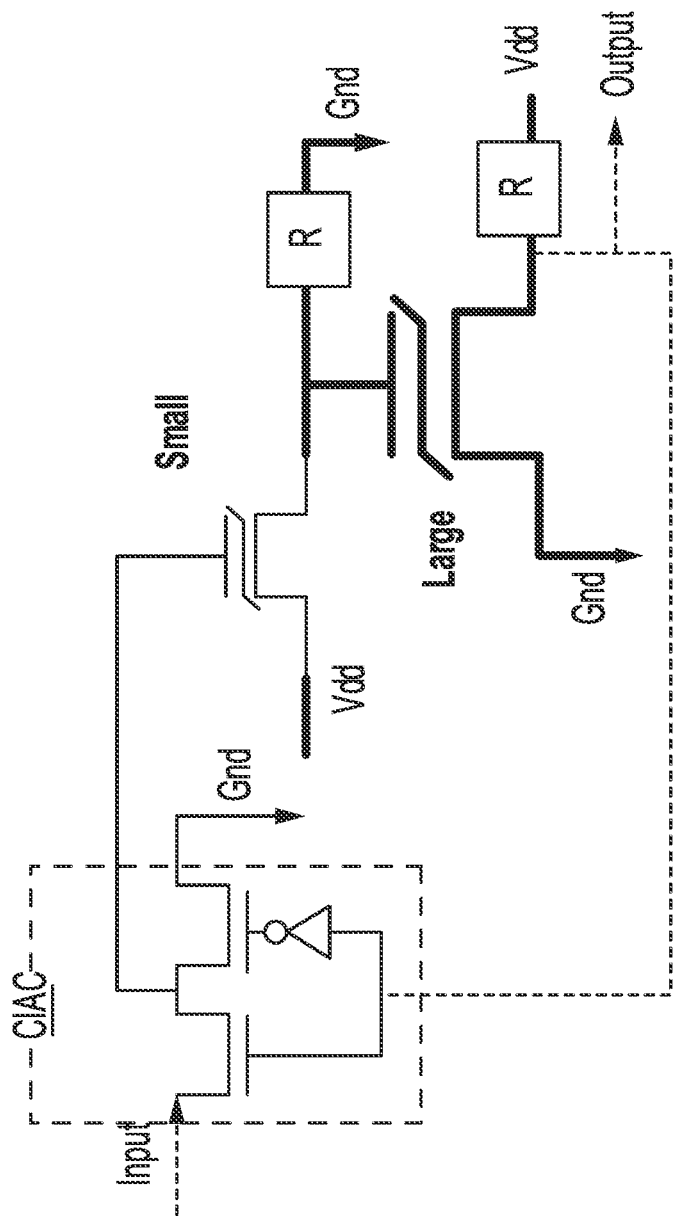
FIG. 9 is a schematic diagram illustrating a sixth configuration of a ferroelectric computation unit according to an embodiment of the present disclosure.

Referring to FIG. 9, a sixth configuration of the ferroelectric computation unit is illustrated, which may be derived from any of the second configuration and the fourth configuration of the ferroelectric computation unit by providing a conditional input activation circuit CIAC. Input to the ferroelectric computation unit may be activated or de-activated based on a pre-existing output state of the ferroelectric computation unit, thereby enabling a sequential logic.

Figure 10:
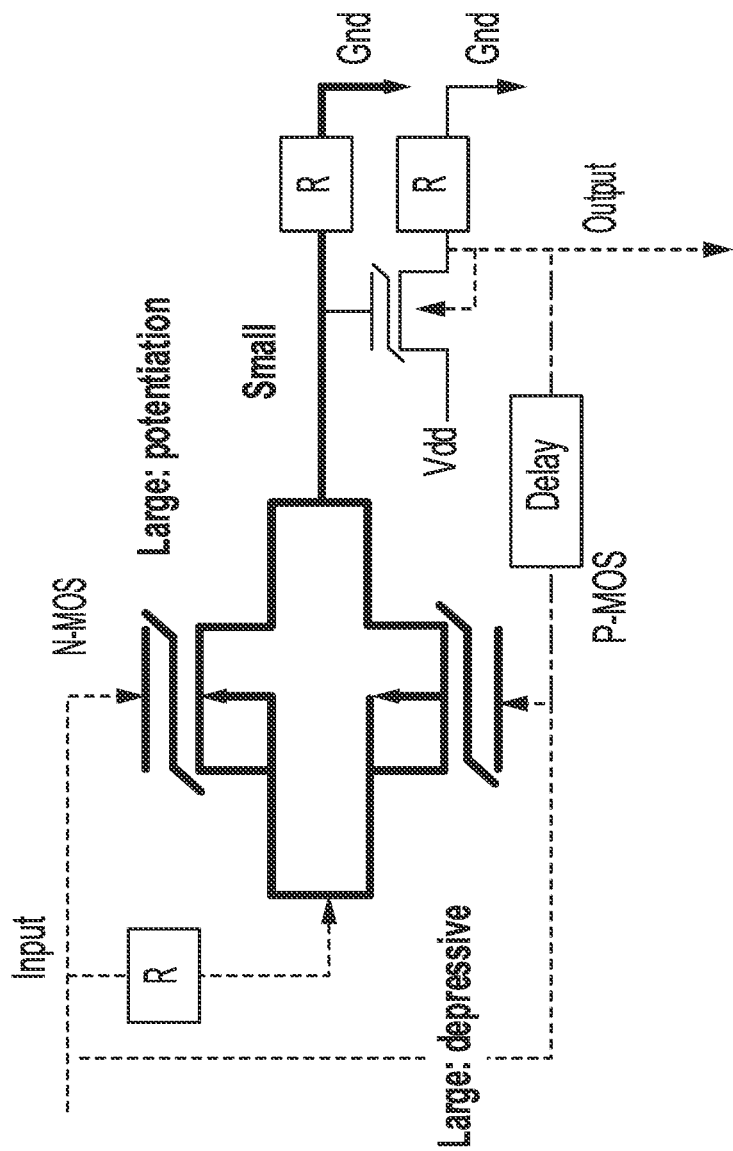
FIG. 10 is a schematic diagram illustrating a seventh configuration of a ferroelectric computation unit according to an embodiment of the present disclosure.

Referring to FIG. 10, a seventh configuration of the ferroelectric computation unit may be derived from the third configuration or the fourth configuration of the ferroelectric computation unit by attaching a third ferroelectric switching device comprising a third ferroelectric material portion. The third ferroelectric material portion may be disposed between a third gate electrode and a third current channel of the third ferroelectric switching device, and may modulate electrical conductivity of the third current channel depending on a third bias voltage at the third gate electrode, and generates an additional analog output signal that is summed with the analog output signal of the second ferroelectric switching device. In one embodiment, one of the second ferroelectric switching device and the third ferroelectric switching device may comprise a p-type field effect transistor, and another of the second ferroelectric switching device and the third ferroelectric switching device may comprise an n-type field effect transistor. The third gate electrode may be electrically connected to the second gate electrode. In one embodiment, the second gate electrode and the third gate electrode may be directly connected to the input node of the ferroelectric computation unit. In one embodiment, the second ferroelectric switching device may be implemented as a large n-type ferroelectric field effect transistor, and the third ferroelectric switching device may be implemented as a large p-type ferroelectric field effect transistor. Optionally, electrical connection to the power supply node Vdd and the electrical ground node Gnd for the series connection of the first ferroelectric switching device and a resistor may be reversed.

The combination of the second ferroelectric switching device and the third ferroelectric switching device may function as an analog non-volatile memory device with computation-in-memory capability. In this embodiment, one of the second ferroelectric switching device and the third ferroelectric switching device may function to provide potentiation of the output voltage (i.e., an increase in the combined output) and the other of the second ferroelectric switching device and the third ferroelectric switching device may function to provide depression of the output voltage (i.e., a decrease in the combined output) through competing activation and deactivation of respective current channels under application of input pulses to the ferroelectric computation unit.

In one embodiment, a potentiation mechanism (i.e., a mechanism for inducing a positive change in the output) and a depressive mechanism (i.e., a mechanism for inducing a negative change in the output) may share the same input signal path and may have output paths that are additively connected, for example, through a parallel connection that is serially connected to a same voltage-dividing element (such as a resistor). Generally, different input and output interfacing/signal-integrating schemes may be used. A delayed feedback from the output of the first ferroelectric switching device can be incorporated to realize the spike-timing-dependent plasticity (STDP) that allows self-adaptation of the state holder through the update function. The exact delay length depends on the task at hand and the pulse width/period of input signal.

Figure 11:
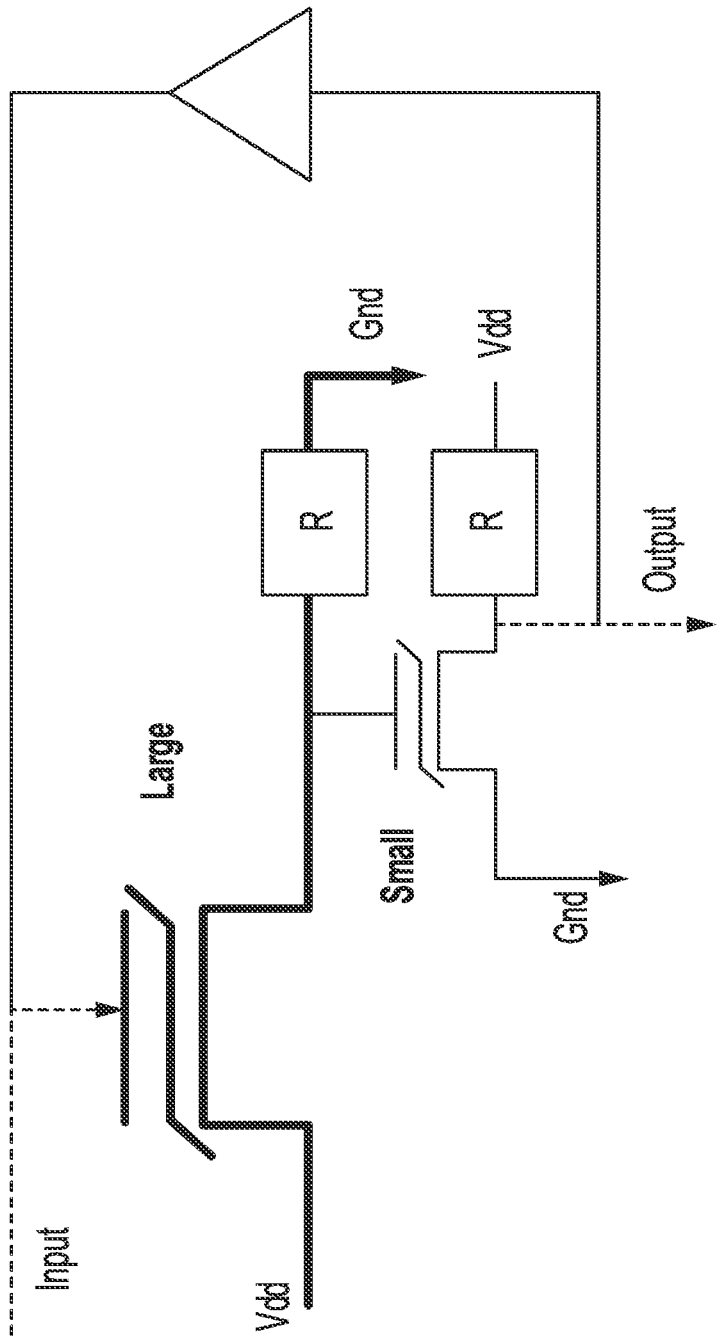
FIG. 11 is a schematic diagram illustrating an eighth configuration of a ferroelectric computation unit according to an embodiment of the present disclosure.

Referring to FIG. 11, an eighth configuration of the ferroelectric computation unit may be derived from any of the first, second, third, and fourth configuration of the ferroelectric computation unit by connecting the output node of the ferroelectric computation unit to the input node of the ferroelectric computation unit through an amplifier that does not invert the polarity of the output signal. Depending on the nature of the electrical connection between the first ferroelectric switching device and the second ferroelectric switching device, this feedback circuit may stabilize a state of the output node of the ferroelectric computation unit (i.e., reinforces the stability of the signal at the output node), or may destabilize a state of the output node of the ferroelectric computation unit (i.e., flips the output at the output node of the ferroelectric computation unit), thereby generating an oscillating signal (which may oscillate stochastically with random variations in the duration of the pulse).

Figure 12:
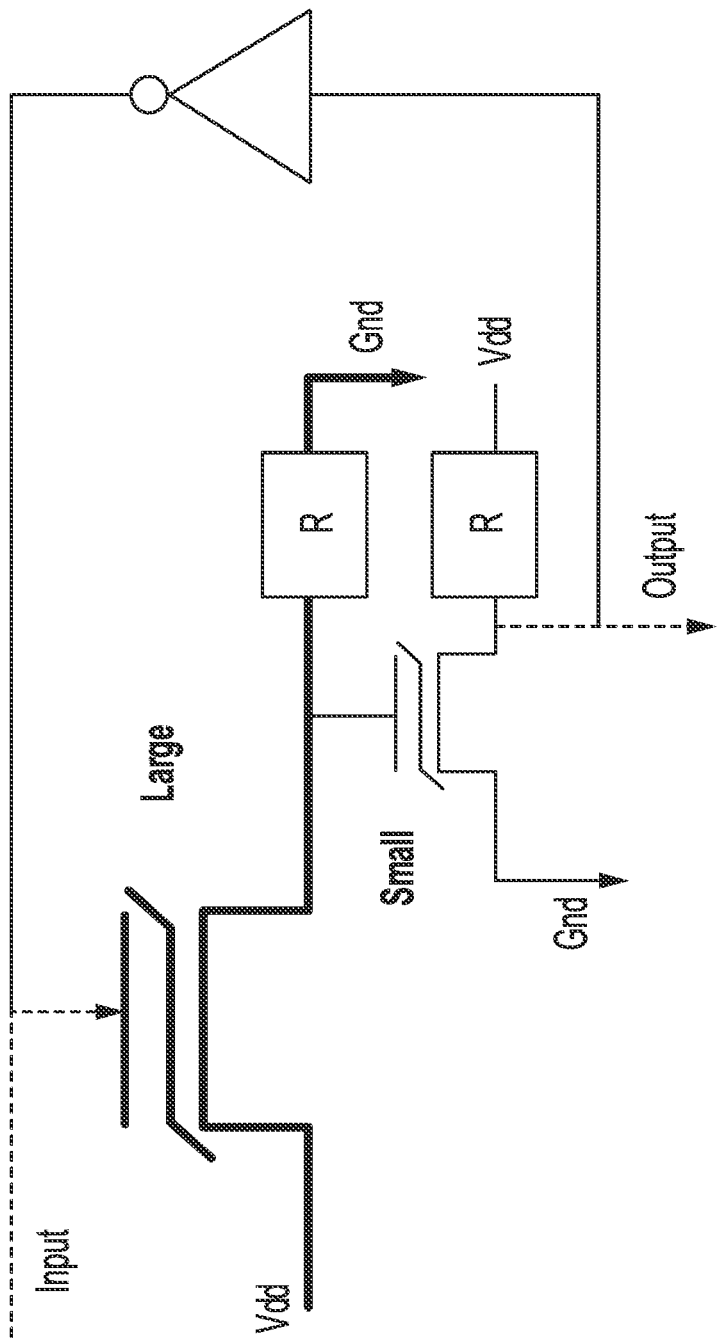
FIG. 12 is a schematic diagram illustrating a ninth configuration of a ferroelectric computation unit according to an embodiment of the present disclosure.

Referring to FIG. 12, a ninth configuration of the ferroelectric computation unit may be derived from any of the first, second, third, and fourth configuration of the ferroelectric computation unit by connecting the output node of the ferroelectric computation unit to the input node of the ferroelectric computation unit through an inverter that inverts the polarity of the output signal. Depending on the nature of the electrical connection between the first ferroelectric switching device and the second ferroelectric switching device, this feedback circuit may stabilize a state of the output node of the ferroelectric computation unit (i.e., reinforces the stability of the signal at the output node), or may destabilize a state of the output node of the ferroelectric computation unit (i.e., flips the output at the output node of the ferroelectric computation unit), thereby generating an oscillating signal (which may oscillate stochastically with random variations in the duration of the pulse).

In each of the ferroelectric computation units illustrated in FIGS. 4-12, n-type ferroelectric field effect transistors are illustrated. A mirror-image circuit may be generated from each of the illustrated examples in FIGS. 4-12 by using a p-type ferroelectric field effect transistor in lieu of a respective n-type ferroelectric field effect transistor (and vice versa). Further, all resistors in FIGS. 4-12 may be replaced with a voltage-generating passive or active circuit element. Thus, each of the resistors in FIGS. 4-12 may be a passive element or an active element, or may have a voltage-amplifying function (such as an operational amplifier).

Referring collectively to FIGS. 4-12, a device comprising a computation unit is provided. The computation unit comprises a digital-output switching device (such as the first ferroelectric switching device) generating a digital output signal and including a first current channel having a first areal size and providing modulated electrical conductivity depending on a first bias voltage at a first gate electrode located adjacent to the first current channel. Further, the computation unit comprises an analog-output switching device (such as the second ferroelectric switching device) generating an analog output signal and including a second current channel having a second areal size and providing modulated electrical conductivity depending on a second bias voltage at a second gate electrode located adjacent to the second current channel. An output node of one of the first ferroelectric switching device and the second ferroelectric switching device is electrically connected to a gate electrode of another of the first ferroelectric switching device and the second ferroelectric switching device.

In one embodiment, the digital-output switching device comprises a first ferroelectric switching device that includes a first ferroelectric material portion having the first areal size, and the analog-output switching device comprises a second ferroelectric switching device that includes a second ferroelectric material portion having the second areal size.

In one embodiment, the digital output signal comprises two different output states providing an output voltage ratio of at least 10 (such as from $1.0 \times 10^2$ to $1.0 \times 10^9$, and/or from $1.0 \times 10^3$ to $1.0 \times 10^6$) or an output current ratio of at least 10 (such as from $1.0 \times 10^2$ to $1.0 \times 10^9$, and/or from $1.0 \times 10^3$ to $1.0 \times 10^6$). In one embodiment, the analog output signal comprises at least ten output states providing an output voltage ratio of less than 2 (which may be in a range from 0.5 to 2.0 and/or from 0.8 to 1.25 and/or from 0.9 to 1.1) or an output current ratio of less than 2 (which may be in a range from 0.5 to 2.0 and/or from 0.8 to 1.25 and/or from 0.9 to 1.1) between any two neighboring pair of output states selected from a set of output states sorted in an increasing order of a magnitude of an output voltage or an output current of the at least ten output states.

In one embodiment, the computation unit comprises at least one feature selected from the following features. The first feature may be that a first resistor is connected in a series connection with the first ferroelectric switching device between a power supply node Vdd and an electrical ground node Gnd, and a second resistor is connected in a series connection with the second ferroelectric switching device between the power supply node Vdd and the electric ground node as illustrated in FIGS. 4, 5, 11, and 12. The second feature may be that a drain region of one of the first ferroelectric switching device and the second ferroelectric switching device is connected an input node of the ferroelectric computation unit through an input-side resistor as illustrated in FIGS. 6, 7, and 10. The third feature is that an output node of the ferroelectric computation unit is connected to an input node of the ferroelectric computation unit in a manner that stabilizes a state of the output node of the ferroelectric computation unit as illustrated in FIGS. 11 and 12. The fourth feature is that an output node of the ferroelectric computation unit is connected to an input node of the ferroelectric computation unit in a manner that destabilizes a state of the output node of the ferroelectric computation unit as illustrated in FIGS. 11 and 12. Additional features are illustrated in FIGS. 8 and 9.

While FIG. 2B illustrates a planar ferroelectric field effect transistor including a planar (i.e., two-dimensional) horizontal semiconductor channel between a source region and a drain region, any other configuration for ferroelectric field effect transistors may also be used to implement the ferroelectric computation unit of the present disclosure.

Figure 13A:
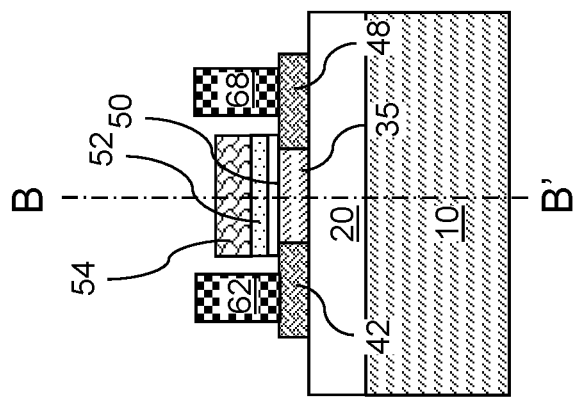
FIG. 13A is a vertical cross-sectional view of a first exemplary ferroelectric field effect transistor that may be used for a ferroelectric switching device according to an embodiment of the present disclosure.
Figure 13B:
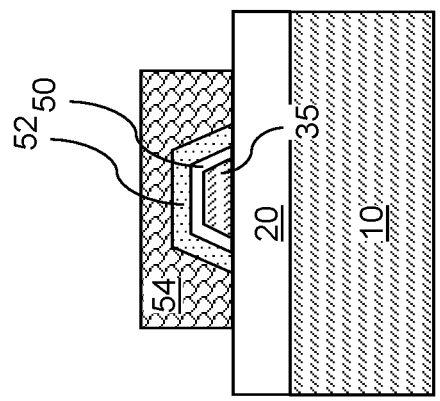
FIG. 13B is a vertical cross-sectional view of the first exemplary ferroelectric field effect transistor along the vertical plane B-B' of FIG. 13A.

Referring to FIGS. 13A and 13B, a semiconductor-on-insulator (SOI)-type ferroelectric field effect transistor is illustrated, which is formed using a semiconductor-on-insulator (SOI) substrate. The SOI-type ferroelectric field effect transistor comprises a handle substrate 10, a buried insulator layer 20, and a semiconductor-on-insulator fin including a current channel layer 35, which may be a semiconducting channel layer. The current channel layer 35 may include, and/or may consist essentially of, doped silicon, a doped silicon-germanium alloy, doped germanium, a doped III-V compound semiconductor material, a doped II-V compound semiconductor material, a semiconducting metal oxide material, or an organic semiconducting material. A source region 42 and a drain region 48 may be formed on end portions of the current channel layer 35. The source region 42 and the drain region 48 may include a doped semiconductor material, or may include a metallic material such as a metal silicide material (e.g., nickel silicide). A gate dielectric (50, 52) including a ferroelectric material portion 52 may be formed over the current channel layer 35. In one embodiment, the gate dielectric (50, 52) may include a layer stack of a non-ferroelectric gate dielectric layer 50 and the ferroelectric material portion 52 comprising a film having a uniform thickness. The thickness of the ferroelectric material portion 52 may be in a range from 10 nm to 100 nm, although lesser and greater thicknesses may also be used. A gate electrode 54 including a gate conductor material may be disposed over the gate dielectric (50, 52). A source contact structure 62 may contact the source region 42, and a drain contact structure 68 may contact the drain region 48. Optionally, amorphous indium gallium zinc oxide may be optionally used as a capping material layer (not illustrated) to function as an effective capping material for the ferroelectric material portion 52, and may help formation of a ferroelectric phase in the ferroelectric material portion 52 during an anneal process, which may be performed after formation of the gate electrode 54.

Figure 14B:
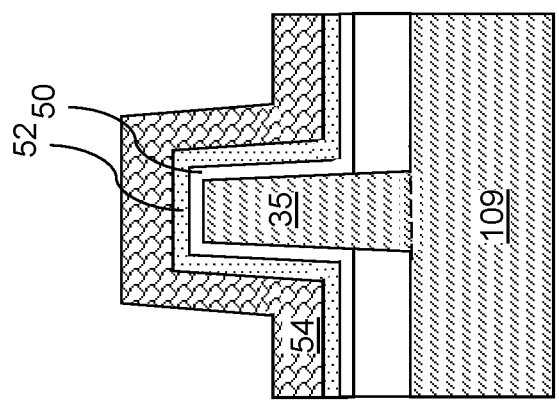
FIG. 14B is a vertical cross-sectional view of the second exemplary ferroelectric field effect transistor along the vertical plane B-B' of FIG. 14A.
Figure 14A:
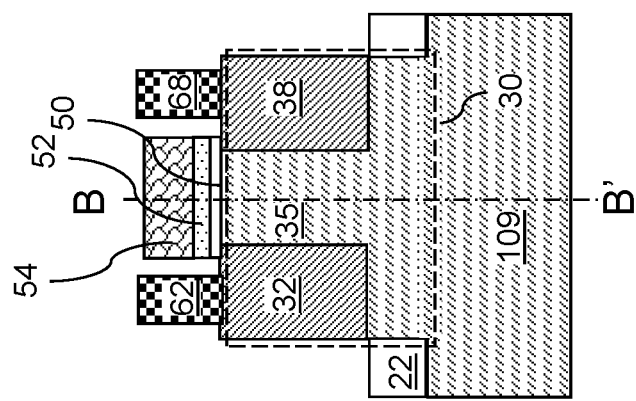
FIG. 14A is a vertical cross-sectional view of a second exemplary ferroelectric field effect transistor that may be used for a ferroelectric switching device according to an embodiment of the present disclosure.

Referring to FIGS. 14A and 14B, a bulk-type ferroelectric field effect transistor is illustrated, which is formed using a bulk semiconductor substrate 109. The bulk semiconductor substrate 109 may include a single crystalline semiconductor material such as single crystalline silicon. The bulk-type ferroelectric field effect transistor comprises a semiconductor fin 30 (comprising a single crystalline semiconductor material portion) comprising a same semiconductor material as, and is epitaxially aligned to, the bulk semiconductor substrate 109. A shallow trench isolation structure 22 may be formed around the semiconductor fin 30, and a gate stack (50, 52, 54) straddling the semiconductor fin 30 may be formed. The gate stack (50, 52, 54) may include a gate dielectric (50, 52) and a gate electrode 54. The gate dielectric (50, 52) includes a ferroelectric material portion 52. In one embodiment, the gate dielectric (50, 52) may include a layer stack of a non-ferroelectric gate dielectric layer 50 and the ferroelectric material portion 52 comprising a film having a uniform thickness. The thickness of the ferroelectric material portion 52 may be in a range from 10 nm to 100 nm, although lesser and greater thicknesses may also be used.

Portions of the semiconductor fin 30 that are not masked by the gate stack (50, 52, 54) may be doped with implanted electrical dopants to form a source region 32 and a drain region 38. The portion of the semiconductor fin 30 that is not doped with the implanted electrical dopants comprise a current channel layer 35. A source contact via structure 62 may provide electrical contact to the source region 32, and a drain contact via structure 68 may provide electrical contact to the drain region 38. Optionally, amorphous indium gallium zinc oxide may be optionally used as a capping material layer (not illustrated) to function as an effective capping material for the ferroelectric material portion 52, and may help formation of a ferroelectric phase in the ferroelectric material portion 52 during an anneal process, which may be performed after formation of the gate electrode 54.

Figure 15:
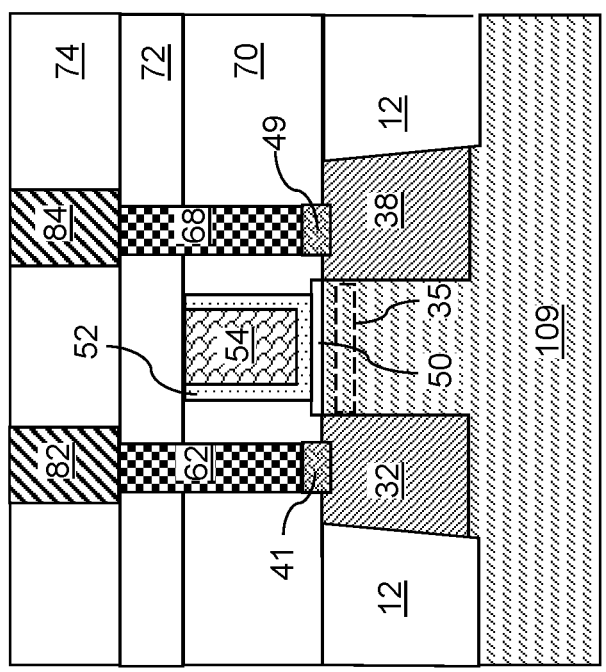
FIG. 15 is a vertical cross-sectional view of a third exemplary ferroelectric field effect transistor that may be used for a ferroelectric switching device according to an embodiment of the present disclosure.

Referring to FIG. 15, a ferroelectric field effect transistor using replaced source and drain regions is illustrated. Shallow trench isolation structures 12 may be formed in an upper portion of a bulk semiconductor substrate 109. A gate dielectric 50 may be formed on a top surface of the bulk semiconductor layer 109. A sacrificial gate structure including a dielectric material (such as silicon nitride) may be formed over the gate dielectric 50. The volume of the sacrificial gate structure may be the same as the volume occupied by a combination of a ferroelectric material portion 52 and the gate electrode 54. An anisotropic etch process may be performed to form a source cavity and a drain cavity in upper portions of the bulk semiconductor substrate 109 that is not occupied by the shallow trench isolation structure 12 and is not masked by the sacrificial gate structure. A selective epitaxy process may be performed to selective grow a source region 32 and a drain region 38 including a single crystalline semiconductor material that is different from the semiconductor material of the bulk semiconductor substrate 109. For example, the source region 32 and the drain region 38 may include a doped silicon-carbon compound or a doped silicon-germanium compound that may apply mechanical stress to a current channel layer 35, which is a surface portion of the bulk semiconductor substrate 109 that is located between the source region 32 and the drain region 38. Charge carrier mobility may be enhanced in the current channel layer 35 due to the mechanical stress.

Subsequently, a planarization dielectric layer 70 including a planarizable dielectric material (such as silicon oxide) may be deposited around the sacrificial gate electrode. The sacrificial gate electrode may be removed selective to the gate dielectric 50 and the planarization dielectric layer 70 by a selective etch process, which may include a wet etch process using hot phosphoric acid in embodiments in which the sacrificial gate electrode comprises silicon nitride. An L-shaped ferroelectric material portion 52 and a gate electrode 54 may be formed within the gate cavity formed by removal of the sacrificial gate electrode by deposition and planarization of a ferroelectric material and a gate electrode material. Optionally, amorphous indium gallium zinc oxide may be optionally used as a capping material layer (not illustrated) to function as an effective capping material for the ferroelectric material portion 52, and may help formation of a ferroelectric phase in the ferroelectric material portion 52 during an anneal process, which may be performed after formation of the gate electrode 54. A contact-level dielectric layer 72 may be formed over the planarization dielectric layer 70. A source contact via structure 62 may provide electrical contact to the source region 32, and a drain contact via structure 68 may provide electrical contact to the drain region 38. Optionally, a source-side metal-semiconductor alloy portion 41 and a drain-side metal-semiconductor alloy portion 49 may be formed. Subsequently, a line-level dielectric layer 74 may be formed, and a source-connection line 82 and a drain-connection line 84 may be formed therein.

Generally, any type of field effect transistor known in the art may be utilized for the ferroelectric field effect transistors embodying any of the ferroelectric computation units described above. For example, planar ferroelectric field effect transistors, fin ferroelectric field effect transistors, omega ferroelectric field effect transistors, nanowire ferroelectric field effect transistors, nanosheet ferroelectric field effect transistors, and other types of field effect transistors may be used. Any type of semiconducting material may be used for the current channel layer 35.

Use of ferroelectric field effect transistors provide an integration scheme for manufacturing a ferroelectric computation unit of the present disclosure in a manner that is compatible with standard logic processes in semiconductor manufacturing. However, the conduction medium for providing a current channel layer is not limited to a semiconductor material, and ions or electrolytes may be used as charge carriers. In case ferroelectric field effect transistors are used as ferroelectric switching devices, each current channel may be a semiconductor chancel channel.

Figure 16:
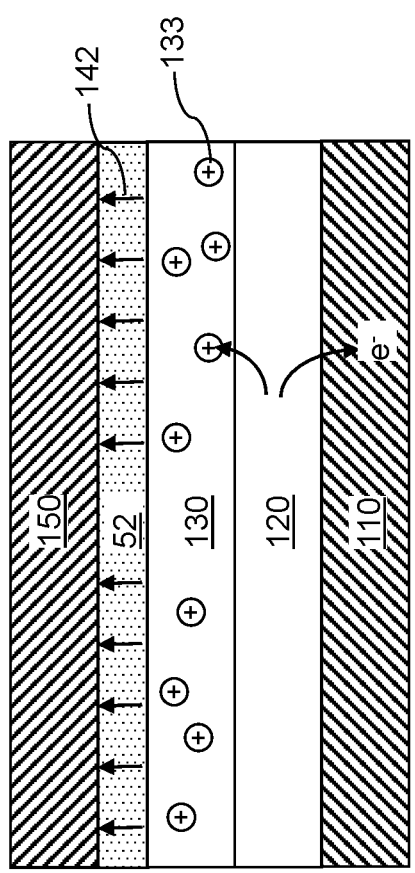
FIG. 16 is a vertical cross-sectional view of an electrolyte-based ferroelectric switching device according to an embodiment of the present disclosure.

Referring to FIG. 16, an exemplary electrolyte-based ferroelectric switching device according to an embodiment of the present disclosure is illustrated, which includes, from bottom to top, a first electrode 110, an organic conductive polymer layer 120, a matrix material layer 130 including electrolytes 133 therein, a ferroelectric material portion 52 comprising a ferroelectric material layer having a uniform thickness and having ferroelectric polarization 142 pointing toward the first electrode 110 or pointing away from the first electrode 110, and a second electrode 150. The first electrode 110 and the second electrode 150 may comprise, and/or may consist essentially of, a conductive material such as a respective metallic material. The organic conductive polymer layer 120 includes a conductive polymer material that may transport ions of an electrolyte. An exemplary material that may be used for the organic conductive polymer layer 120 includes, but is not limited to, poly(3,4-ethylenedioxythiophene):polystyrene sulfonate (PEDOT:PSS), which is an organic mixed ion-electron conducting polymer material. The PEDOT phase transports holes and is redox-active, whereas the PSS phase transports ions. The matrix material layer 130 may be a liquid layer, or may include a porous solid phase material including holes that provide lateral transport of the electrolytes 133.

The exemplary electrolyte-based ferroelectric switching device is an electrochemical device in which the ferroelectric polarization 142 in the ferroelectric material portion 52 modulates electrical conduction of the electrolytes 133 through the matrix material layer 130. In this case, each of the first ferroelectric switching device may comprise a first electrolyte-based ferroelectric switching device including a first current channel, and each of the second ferroelectric switching device may comprise a second electrolyte-based ferroelectric switching device including a second current channel. In this embodiment, the first current channel comprises a first matrix material layer 130 including first electrolytes 133 and in contact with a first ferroelectric material portion 52, and the second current channel comprises a second matrix material layer 130 including second electrolytes 133 and in contact with the second ferroelectric material portion 52. Generally, the first matrix material layer 130 and the second matrix material layer 130 may be formed by patterning a same matrix material layer having a uniform thickness, and the first electrolytes 133 may be the same as the second electrolytes 133. Generally, each layer within the first ferroelectric switching device may have the same material composition and the same thickness as a corresponding layer within the second ferroelectric switching device. The area of each layer within the second ferroelectric switching device may be greater than the area of a corresponding layer within the first ferroelectric switching device by a factor of 4 to 1,000, such as from 10 to 300.

Figure 17:
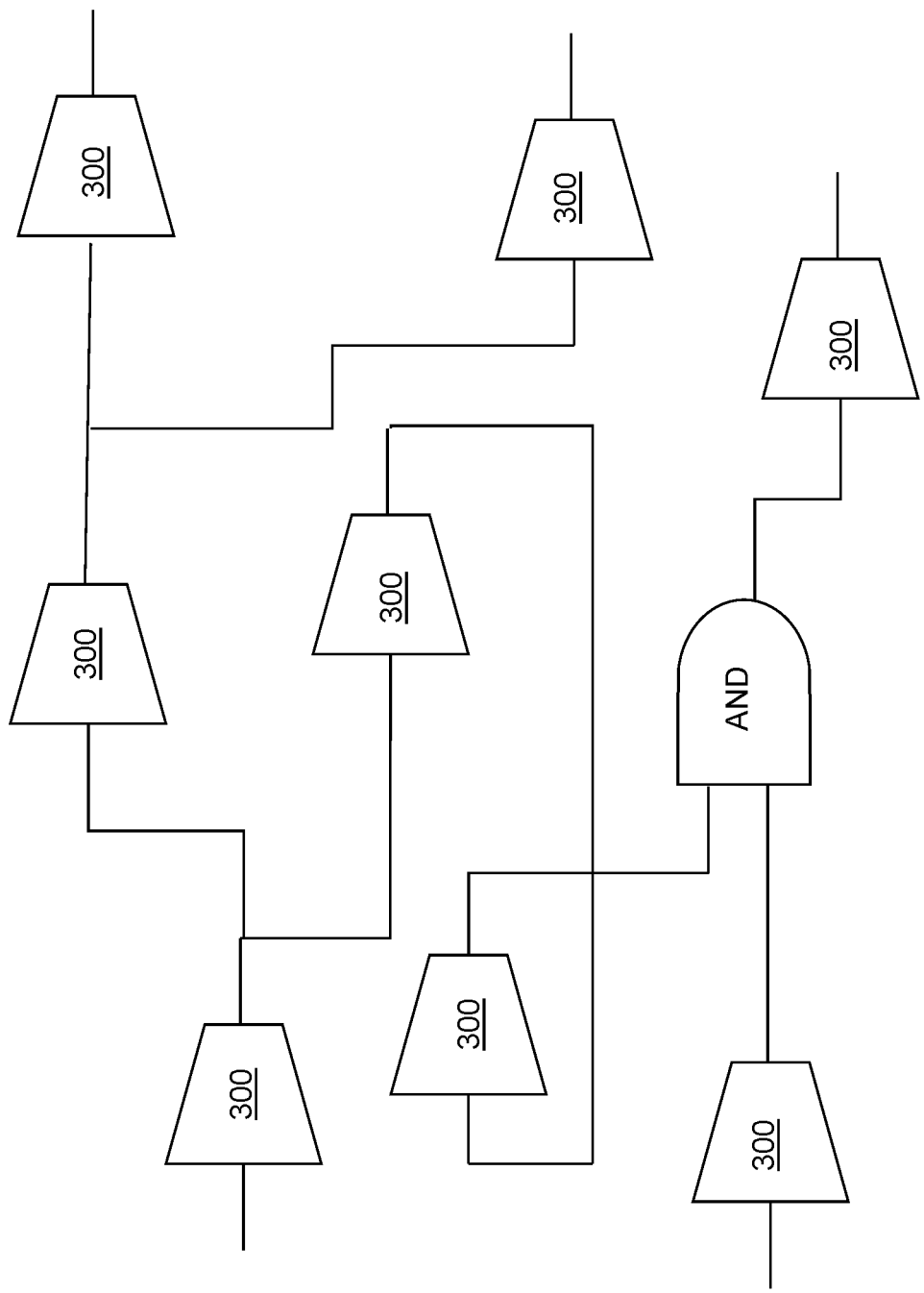
FIG. 17 is a schematic view of a neuromorphic computation device including multiple instances of the ferroelectric computation units according to an embodiment of the present disclosure.

Referring to FIG. 17, an exemplary computation-in-memory device including multiple instances of the ferroelectric computation units 300 is illustrated according to an embodiment of the present disclosure. Each of the ferroelectric computation units 300 may be any of the ferroelectric computation units described above. Thus, in addition to a ferroelectric computation unit 300, additional ferroelectric computation units 300 comprising a combination of a respective additional first ferroelectric switching device and a respective additional second ferroelectric switching device may be provided. The ferroelectric computation unit 300 and the additional computation units 300 may be electrically connected to one another to provide a neuromorphic computation device including a plurality of input nodes.

Figure 18:
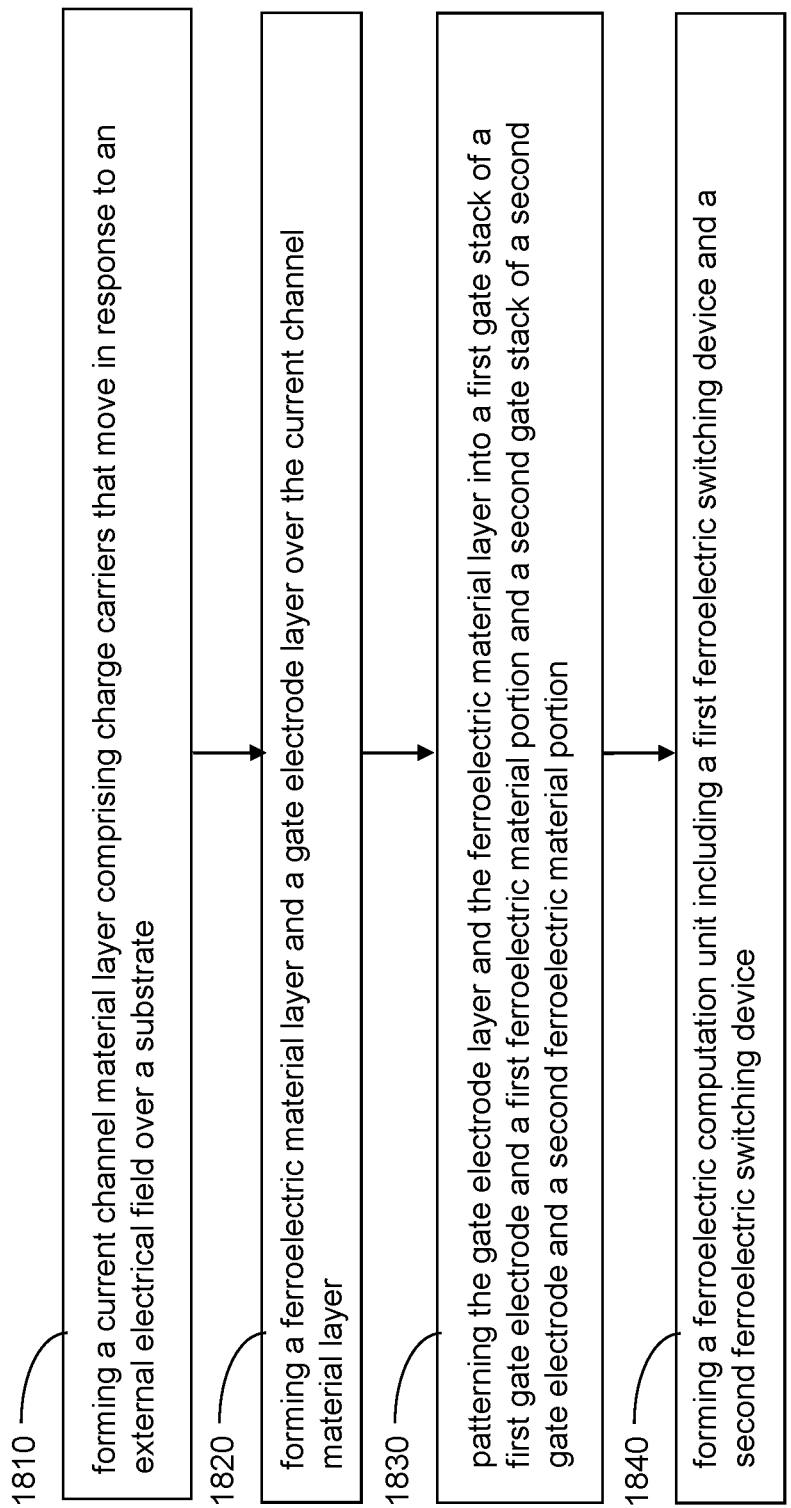
FIG. 18 is a flowchart that illustrates the general processing steps for manufacturing a ferroelectric computation device of the present disclosure.

Referring to FIG. 18, a flowchart illustrates general processing steps for manufacturing a ferroelectric computation unit of the present disclosure.

Referring to step 1810 and FIGS. 1-17 collectively, a current channel material layer comprising charge carriers that move in response to an external electrical field may be formed over a substrate.

Referring to step 1820 and FIGS. 1-17 collectively, a ferroelectric material layer and a gate electrode layer may be formed over the current channel material layer.

Referring to step 1830 and FIGS. 1-17 collectively, the gate electrode layer and the ferroelectric material layer may be patterned into a first gate stack of a first gate electrode (such as a gate electrode 54 in FIGS. 13A-15 or the second electrode 150 in FIG. 16) and a first ferroelectric material portion 52 and a second gate stack of a second gate electrode (such as a gate electrode 54 in FIGS. 13A-15 or the second electrode 150 in FIG. 16) and a second ferroelectric material portion 52. A portion of the current channel material layer that underlies the first ferroelectric material portion 52 comprises a first current channel (such as a current channel layer 35 in FIGS. 13A-15 or the matrix material layer 130 in FIG. 16) and a portion of the current channel material layer that underlies the second ferroelectric material portion 52 comprises a second current channel (such as a current channel layer 35 in FIGS. 13A-15 or the matrix material layer 130 in FIG. 16).

Referring to step 1840 and FIGS. 1-17 collectively, a ferroelectric computation unit including a first ferroelectric switching device and a second ferroelectric switching device may be formed by electrically connecting the first current channel, the second current channel, the first gate electrode, and the second gate electrode. The first ferroelectric switching device generates a digital output signal. The second ferroelectric switching device generates an analog output signal. An output node of one of the first ferroelectric switching device and the second ferroelectric switching device is electrically connected to a gate electrode of another of the first ferroelectric switching device and the second ferroelectric switching device.

In one embodiment, the first ferroelectric material portion 52 comprises a ferroelectric material domain having a same ferroelectric polarization therein and occupying at least 80% of an entire volume of the first ferroelectric material portion 52, and the second ferroelectric material portion 52 comprises at least five ferroelectric material domains occupying a respective volume that is less than 25% of an entire volume of the second ferroelectric material portion 52.

In one embodiment, the first ferroelectric material portion 52 has a first areal size, the second ferroelectric material portion 52 has a second areal size, and a ratio of the second areal size to the first areal size is in a range from 4 to 1,000.

In one embodiment, the first ferroelectric switching device comprises a first field effect transistor in which the first current channel is a first semiconductor channel, and the second ferroelectric switching device comprises a second field effect transistor in which the second current channel is a second semiconductor channel.

In one embodiment, the current channel material layer comprises a matrix material layer containing electrolytes therein.

Generally, the same type of devices having different sizes may be used to provide the functionality of a digital-output switching device generating a digital output signal and an analog-output switching device generating an analog output signal. The various ferroelectric computation units of the present disclosure may provide a neuromorphic computation device having high performance, small in size, and providing low power consumption.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric device comprising a ferroelectric computation unit, the ferroelectric computation unit comprising:
 a first ferroelectric switching device comprising a first ferroelectric material portion having a first areal size and disposed between a first gate electrode and a first current channel and modulating electrical conductivity of the first current channel depending on a first bias voltage at the first gate electrode and generating a digital output signal; and
 a second ferroelectric switching device comprising a second ferroelectric material portion having a second areal size that is greater than the first areal size and disposed between a second gate electrode and a second current channel and modulating electrical conductivity of the second current channel depending on a second bias voltage at the second gate electrode and generating an analog output signal, wherein an output node of one of the first ferroelectric switching device and the second ferroelectric switching device is electrically connected to a gate electrode of another of the first ferroelectric switching device and the second ferroelectric switching device.

2. The ferroelectric device of claim 1, wherein the first ferroelectric switching device has stochastic switching characteristics in which determination of the digital output signal is probabilistic within an input voltage range for the first bias voltage.

3. The ferroelectric device of claim 1, wherein the digital output signal is selected from a set of no more than four discrete output signals.

4. The ferroelectric device of claim 1, wherein:
the first ferroelectric material portion comprises a ferroelectric material domain having a same ferroelectric polarization therein and occupying at least 80% of an entire volume of the first ferroelectric material portion; and
the second ferroelectric material portion comprises at least five ferroelectric material domains occupying a respective volume that is less than 25% of an entire volume of the second ferroelectric material portion.

5. The ferroelectric device of claim 1, wherein the first ferroelectric material portion and the second ferroelectric material portion have a same thickness and a same material composition.

6. The ferroelectric device of claim 5, wherein a ratio of the second areal size to the first areal size is in a range from 4 to 1,000.

7. The ferroelectric device of claim 1, wherein:
the first ferroelectric switching device comprises a first field effect transistor in which the first current channel is a first semiconductor channel and the first ferroelectric material portion is a portion of a first gate dielectric; and
the second ferroelectric switching device comprises a second field effect transistor in which the second current channel is a second semiconductor channel and the second ferroelectric material portion is a portion of a second gate dielectric.

8. The ferroelectric device of claim 1, wherein:
the first current channel comprises a first matrix material layer including first electrolytes and in contact with the first ferroelectric material portion; and
the second current channel comprises a second matrix material layer including second electrolytes and in contact with the second ferroelectric material portion.

9. The ferroelectric device of claim 1, wherein the ferroelectric device comprises at least one feature selected from:
a first feature that a first resistor is connected in a series connection with the first ferroelectric switching device between a power supply node and an electrical ground node, and a second resistor is connected in a series connection with the second ferroelectric switching device between the power supply node and the electric ground node;
a second feature that a drain region of one of the first ferroelectric switching device and the second ferroelectric switching device is connected to an input node of the ferroelectric computation unit through an input-side resistor;
a third feature that an output node of the ferroelectric computation unit is connected to an input node of the ferroelectric computation unit in a manner that stabilizes a state of the output node of the ferroelectric computation unit; and
a fourth feature that an output node of the ferroelectric computation unit is connected to an input node of the ferroelectric computation unit in a manner that destabilizes a state of the output node of the ferroelectric computation unit.

10. The ferroelectric device of claim 1, wherein the ferroelectric computation unit comprises a conditional input activation circuit that activates, or deactivates, an input to the ferroelectric computation unit based on a pre-existing output state of the ferroelectric computation unit.

11. The ferroelectric device of claim 1, wherein:
the ferroelectric computation unit comprises a third ferroelectric switching device comprising a third ferroelectric material portion and disposed between a third gate electrode and a third current channel and modulating electrical conductivity of the third current channel depending on a third bias voltage at the third gate electrode and generating an additional analog output signal that is summed with the analog output signal of the second ferroelectric switching device;
one of the second ferroelectric switching device and the third ferroelectric switching device comprises a p-type field effect transistor and another of the second ferroelectric switching device and the third ferroelectric switching device comprises an n-type field effect transistor; and
the third gate electrode is electrically connected to the second gate electrode.

12. The ferroelectric device of claim 1, further comprises additional ferroelectric computation units comprising a combination of a respective additional first ferroelectric switching device and a respective additional second ferroelectric switching device, wherein the ferroelectric computation unit and the additional computation units are electrically connected to one another to provide a neuromorphic computation device including a plurality of input nodes.

13. A device comprising a computation unit, the computation unit comprising:
a digital-output switching device generating a digital output signal and including a first current channel providing modulated electrical conductivity depending on a first bias voltage at a first gate electrode located adjacent to the first current channel; and
an analog-output switching device generating an analog output signal and including a second current channel providing modulated electrical conductivity depending on a second bias voltage at a second gate electrode located adjacent to the second current channel,
wherein an output node of one of the digital-output switching device and the analog-output switching device is electrically connected to a gate electrode of another of the digital-output switching device and the analog-output switching device.

14. The device of claim 13, wherein:
the digital-output switching device comprises a first ferroelectric switching device that includes a first ferroelectric material portion having a first areal size; and
the analog-output switching device comprises a second ferroelectric switching device that includes a second ferroelectric material portion having a second areal size.

15. The device of claim 13, wherein:
the digital output signal comprises two different output states providing an output voltage ratio of at least 10 or an output current ratio of at least 10; and
the analog output signal comprises at least ten output states providing an output voltage ratio of less than 2 or an output current ratio of less than 2 between any two neighboring pair of output states selected from a set of output states sorted in an increasing order of a magnitude of an output voltage or an output current of the at least ten output states.

16. The device of claim 13, wherein the computation unit comprises at least one feature selected from:
a first feature that a first resistor is connected in a series connection with the first ferroelectric switching device between a power supply node and an electrical ground node, and a second resistor is connected in a series connection with the second ferroelectric switching device between the power supply node and the electric ground node;
a second feature that a drain region of one of the first ferroelectric switching device and the second ferroelectric switching device is connected to an input node of the ferroelectric computation unit through an input-side resistor;
a third feature that an output node of the ferroelectric computation unit is connected to an input node of the ferroelectric computation unit in a manner that stabilizes a state of the output node of the ferroelectric computation unit; and
a fourth feature that an output node of the ferroelectric computation unit is connected to an input node of the ferroelectric computation unit in a manner that destabilizes a state of the output node of the ferroelectric computation unit.

17. A ferroelectric device comprising a ferroelectric computation unit, the ferroelectric computation unit comprising:
a first ferroelectric switching device comprising a first ferroelectric material portion disposed between a first gate electrode and a first current channel and modulating electrical conductivity of the first current channel depending on a first bias voltage at the first gate electrode and generating a digital output signal, wherein the first ferroelectric switching device has stochastic switching characteristics in which determination of the digital output signal is probabilistic within an input voltage range for the first bias voltage; and
a second ferroelectric switching device comprising a second ferroelectric material portion and disposed between a second gate electrode and a second current channel and modulating electrical conductivity of the second current channel depending on a second bias voltage at the second gate electrode and generating an analog output signal,
wherein an output node of one of the first ferroelectric switching device and the second ferroelectric switching device is electrically connected to a gate electrode of another of the first ferroelectric switching device and the second ferroelectric switching device.

18. The ferroelectric device of claim 17, wherein:
the first ferroelectric material portion comprises a ferroelectric material domain having a same ferroelectric polarization therein and occupying at least 80% of an entire volume of the first ferroelectric material portion; and
the second ferroelectric material portion comprises at least five ferroelectric material domains occupying a respective volume that is less than 25% of an entire volume of the second ferroelectric material portion.

19. The ferroelectric device of claim 17, wherein the first ferroelectric material portion and the second ferroelectric material portion have a same thickness and a same material composition.

20. The ferroelectric device of claim 17, wherein:
the first current channel comprises a first matrix material layer including first electrolytes and in contact with the first ferroelectric material portion; and
the second current channel comprises a second matrix material layer including second electrolytes and in contact with the second ferroelectric material portion.

* * * * *